United States Patent
Grodzki et al.

(10) Patent No.: US 11,733,330 B2
(45) Date of Patent: Aug. 22, 2023

(54) MAGNETIC RESONANCE TOMOGRAPHY SCANNER AND METHOD FOR OPERATING WITH DYNAMIC B0 COMPENSATION

(71) Applicant: Siemens Healthcare GmbH, Erlangen (DE)

(72) Inventors: David Grodzki, Erlangen (DE); Michael Köhler, Nuremberg (DE); Dieter Ritter, Fürth (DE)

(73) Assignee: Siemens Healthcare GmbH, Erlangen (DE)

( * ) Notice: Subject to any disclaimer, the term of this patent is extended or adjusted under 35 U.S.C. 154(b) by 143 days.

(21) Appl. No.: 17/168,366

(22) Filed: Feb. 5, 2021

(65) Prior Publication Data
US 2021/0278492 A1   Sep. 9, 2021

(30) Foreign Application Priority Data
Mar. 5, 2020   (DE) .......................... 102020202830.3

(51) Int. Cl.
*G01R 33/44* (2006.01)
*G01R 33/483* (2006.01)
*G01R 33/34* (2006.01)

(52) U.S. Cl.
CPC ..... *G01R 33/445* (2013.01); *G01R 33/34038* (2013.01); *G01R 33/4831* (2013.01); *G01R 33/4838* (2013.01)

(58) Field of Classification Search
CPC ............ G01R 33/445; G01R 33/34038; G01R 33/4831; G01R 33/4838
See application file for complete search history.

(56) References Cited

U.S. PATENT DOCUMENTS

| | | | | |
|---|---|---|---|---|
| 9,753,108 B2* | 9/2017 | Pfeuffer | ............ | G01R 33/5608 |
| 2009/0261823 A1* | 10/2009 | Yu | ....................... | G01R 33/4828 |
| | | | | 324/307 |
| 2010/0156411 A1* | 6/2010 | Setsompop | ........ | G01R 33/4833 |
| | | | | 324/307 |
| 2010/0308822 A1* | 12/2010 | Prado | ................... | G01R 33/448 |
| | | | | 324/309 |

(Continued)

FOREIGN PATENT DOCUMENTS

| | | |
|---|---|---|
| DE | 102010004514 A1 | 7/2011 |
| DE | 102016214088 A1 | 2/2018 |

OTHER PUBLICATIONS

German Office Action for German Application No. 10 2020 202 830.3 dated Dec. 16, 2020.

(Continued)

*Primary Examiner* — Dixomara Vargas
(74) *Attorney, Agent, or Firm* — Lempia Summerfield Katz LLC

(57) ABSTRACT

The disclosure relates to a magnetic resonance tomography scanner and to a method for operating the magnetic resonance tomography scanner. The method includes determining a B0 field map. The method further includes determining an excitation of the nuclear spins to be achieved and a spectrally selective excitation pulse for transmission by a transmitter by way of an antenna as a function of the B0 field map. In the method, the excitation pulse is configured here to generate the excitation of the nuclear spins to be achieved in the patient. The excitation pulse is then output by way of the antenna.

20 Claims, 2 Drawing Sheets

(56) References Cited

U.S. PATENT DOCUMENTS

| | | | |
|---|---|---|---|
| 2011/0172515 A1 | 7/2011 | Fautz et al. | |
| 2011/0254547 A1* | 10/2011 | Reeder | G01R 33/4828 |
| | | | 324/309 |
| 2012/0176132 A1* | 7/2012 | Nishihara | A61B 5/055 |
| | | | 324/309 |
| 2015/0309133 A1* | 10/2015 | Sun | G01R 33/5614 |
| | | | 324/309 |
| 2016/0169997 A1* | 6/2016 | Fautz | G01R 33/543 |
| | | | 324/309 |
| 2018/0031652 A1 | 2/2018 | Paul et al. | |
| 2019/0025390 A1* | 1/2019 | Hwang | G01R 33/543 |
| 2021/0123993 A1* | 4/2021 | Wang | G01R 33/543 |

OTHER PUBLICATIONS

Majewski, Kurt, and Dieter Ritter "First and second order derivatives for optimizing parallel RF excitation waveforms." Journal of Magnetic Resonance 258 (2015): 65-80.
Ouestions and Answers in MRI, Allen D. Elster, "Magnetic Field Gradient Defined—What is a gradient?", URL: http://mriquestions.com/what-is-agradient.html, Nov. 18, 2018. pp. 1-2.

* cited by examiner

| | |
|---|---|
| 1 MRT scanner | 20 Control unit |
| 2 Longitudinal direction | 21 Gradient controller |
| 10 Magnet unit | 22 RF unit |
| 11 Field magnet | 23 Controller |
| 12 Gradient coils | 24 Storage unit |
| 14 Body coil | 25 Signal bus |
| 15 Transmit elements | 30 Patient couch |
| 16 Patient tunnel | 36 Moving unit |
| | 50 Local coil |
| | 60 Transmitter |

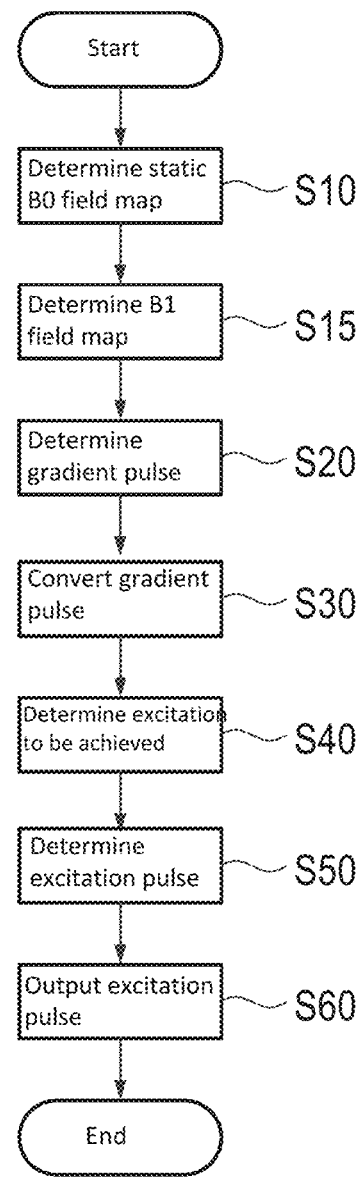

MAGNETIC RESONANCE TOMOGRAPHY SCANNER AND METHOD FOR OPERATING WITH DYNAMIC B0 COMPENSATION

The present patent document claims the benefit of German Patent Application No. 10 2020 202 830.3, filed Mar. 5, 2020, which is hereby incorporated by reference in its entirety.

TECHNICAL FIELD

The disclosure relates to a magnetic resonance tomography scanner and to a method for operating the magnetic resonance tomography scanner. In the method, an excitation pulse for exciting nuclear spins is determined and transmitted as a function of the B0 field map and the gradient pulse.

BACKGROUND

Magnetic resonance tomography scanners are imaging apparatuses which, in order to map an examination object, align nuclear spins of the examination object with a strong external magnetic field B0 and use a magnetic alternating field to excite the nuclear spins for precession about this alignment. The precession or return of the spins from this excited state into a state with less energy in turn generates, as a response, a magnetic alternating field which is received by way of antennas.

With the aid of magnetic gradient fields, a spatial encoding is impressed onto the signals, which then permits an assignment of the received signal to a volume element. The received signal is then evaluated and a three-dimensional imaging representation of the examination object is provided.

The quality of the images produced is significantly dependent here upon the homogeneity of the magnetic field for aligning the nuclear spins. It is known to improve the homogeneity of the static magnetic field by shim coils and to take into consideration dynamic effects as a result of eddy currents in the design of the gradient pulses.

SUMMARY AND DESCRIPTION

The object is therefore to configure the imaging in a magnetic resonance tomography scanner to be better and more cost-effective.

The object is achieved by a method and a magnetic resonance tomography scanner as disclosed herein. The scope of the present disclosure is defined solely by the appended claims and is not affected to any degree by the statements within this summary. The present embodiments may obviate one or more of the drawbacks or limitations in the related art.

The magnetic resonance tomography scanner has a controller. The controller is configured to control an image acquisition with the magnetic resonance tomography scanner and optionally also to perform an image reconstruction. In particular, the controller is also configured to realize the method described below on the magnetic resonance tomography scanner.

The magnetic resonance tomography scanner also has a field magnet for generating a static homogeneous magnetic field B0. The field magnet may be a superconducting magnet, although electromagnets with a resistive winding or permanent magnets are also conceivable with lower field strengths, less than 1 T, 0.5 T, or 0.1 T.

The magnetic resonance tomography scanner has gradient coils for generating magnetic field gradients, which span a space, in most cases Gx, Gy, Gz, and a gradient controller for generating the dynamic currents required for the gradient fields. The gradient coils may be embodied as pairs in the form of a Helmholtz coil pair or as saddle coils.

The magnetic resonance tomography scanner has a transmitter and an antenna for generating a magnetic alternating field B1 for exciting nuclear spins in a patient. The transmitter is configured to transmit an excitation pulse, which may vary in amplitude, phase, and frequency over time. To this end, a signal may be provided in the base band, which is then brought to the Larmor frequency by mixing and may vary in frequency and/or amplitude over time by modulation. The resulting radio frequency signal is then amplified by a power stage of the transmitter and radiated into the patient via an antenna or transmit antenna, (e.g., a body coil and/or local coil), as a predominantly magnetic radio frequency alternating field B1.

The magnetic resonance tomography scanner also has a receive antenna, (e.g., a local coil), and a receiver for receiving a magnetic resonance signal from the patient. The receiver prepares the received magnetic resonance signals for an image reconstruction.

In the method for operating a magnetic resonance tomography scanner, in one act, the controller determines a B0 field map, e.g., data relating to spatial variations of the B0 field in the recording region of the magnetic resonance tomography scanner. In contrast to the B1 field, a B0 field is considered to be a magnetic field which has variations over time only with frequencies which lie significantly below the Larmor frequency, (e.g., by the factor 10, 50, or greater). The B0 field map may be stored in a storage unit of the controller, e.g., if a field distribution for the magnetic resonance tomography scanner was already determined during production by measurement with a field camera or by calculation. It is also conceivable for the controller to determine this in an up-to-date manner at the start of a sequence by a magnetic resonance measurement or by simulation, e.g., by taking into consideration the position and other properties of the patient or settings of the magnetic resonance tomography scanner such as shim currents through shim coils.

In a further act, the controller determines an excitation of the nuclear spins to be achieved, e.g., in a volume to be examined. This may depend on the sequence used and on the sub-act of the sequence currently to be realized. Examples of special excitations are specified in the subclaims. A desired flip angle of the nuclear spins such as 90 degrees of 180 degrees may be the standard. This may involve a selective excitation of specific cores or cores of atoms in special bindings with different Larmor frequencies, for which examples are disclosed herein.

In a further act, the controller determines an excitation pulse for transmission through the transmitter by way of the antenna, wherein the excitation pulse is configured to achieve the previously specified excitation. This is to be understood to mean that the excitation of the nuclear spins to be excited in a volume to be acquired, for instance a layer to be mapped in the body of the patient, deviates by less than 10%, 5%, 1%, or 0.1% from the excitation to be achieved. When the excitation pulse is determined, the B0 field map is taken into consideration, and possibly gradient fields present in the volume to be acquired. Here, the gradient fields may also be considered to be part of the B0 field and contained in the B0 field map. It is also conceivable, for instance, to determine the spin excitation as a function of the B0 field map and the excitation pulse by an optimization method such as Least Square Root (LSR), method of minimal square deviation by Bloch equations and to minimize deviations from the specified excitation until these lie below a predetermined deviation. Parameterized stored models for excitation pulses are also conceivable, for instance, in which the parameters are optimized or also tables with predetermined excitation pulses, in which one with a minimal deviation is selected.

The excitation pulse is a spectrally selective excitation pulse. Spectrally selective within the context of the disclosure is considered to be that the excitation pulse excites the different types of nuclear spins or binding types in a predetermined manner only on account of different Larmor frequencies of the nuclear spins, caused by different cores, (e.g., by identical cores in different chemical bindings), e.g., causes a predetermined change in the alignment of the nuclear spins in the B0 magnetic field. For instance, provision may be made for the nuclear spins in one binding type through the spectrally selective excitation pulse to assume a complete alignment counter to the magnetic field direction or a flip angle of 90 degrees, while the nuclear spins in a different binding type do not experience a change in alignment. Here, the Larmor frequency may differ by less than 100 per mill, 50 per mill, 10 per mill, 5 per mill, or 1 per mill as a result of the different bindings.

In a further act of the method, according to the sequence the controller outputs the determined excitation pulse by way of the transmitter and the antenna. "Output according to the sequence" is to be understood here to mean that the excitation pulse is transmitted at a predetermined point in time as specified by the sequence. This may include a temporally predetermined output in respect of gradient fields.

It is advantageously possible with the magnetic resonance tomography scanner and with the method to take into consideration and compensate for spatial variations in the B0 field in the excitation pulses. In this way, the image quality may be improved, the outlay for the compensation or prevention of B0 field deviations such as active or passive shimming may be reduced, or the electromagnetic load (SAR) for the patient may also be reduced or with the same load the image quality may be improved.

In one conceivable embodiment of the method, the method includes an act S15 in which a B1 field map is determined. The B1 field map specifies variations in the amplitude of the radio frequency magnetic B1 alternating field, which is generated when an excitation pulse is transmitted by the transmitter by way of the antenna. This may also be caused by the geometry of the antenna or also by the interaction with the patient, e.g., a damping or absorption in the body. A B1 field map may be carried out, for instance, in advance or also with the patient by exciting and reading out a phantom, for instance, by phase-sensitive mapping or by Bloch-Siegert shift. In the act of determining a spectrally selective excitation pulse, the determination is then carried out as a function of the B1 field map. For instance, an amplitude of the B1 field which is identified in the B1 field map and reduced locally in one area may be balanced out by a higher amplitude of the excitation signal in this region with a multichannel transmitter or by a longer duration of the excitation signal. If the area of the B1 field variation correlates spatially with a different B0 field on account of gradients or B0 field variations, a variation in the amplitude for corresponding spectral portions of the excitation pulse may also be used for spatial homogenization of the excitation by the excitation pulse on account of different Larmor frequencies.

The excitation pulse may thus advantageously also be used to reduce an inhomogeneity, produced by B1 variation, in the images produced.

In one possible embodiment of the method, the spectrally selective excitation pulse is configured to achieve a saturation of nuclear spins of a first binding type in the volume to be examined as the excitation to be achieved. Depending on the sequence, a predetermined flip angle for saturation may differ here, (e.g., correspond to the value of 90 degrees or 180 degrees), wherein deviations of up to +−10 degrees or +−20 degrees may also be tolerated here. Saturation of the nuclear spins is considered here to mean if more than 80%, 90%, 95%, or 99% of the nuclear spins of the first binding type assume the predetermined flip angle or in the tolerance range about the flip angle.

Fading out the saturation of the nuclear spins of a first core type or a first binding type by saturation pulses is a current method of fading out fat in the imaging, for instance. The technique is disturbed by B0 field fluctuations, e.g., by different tissue limits with a different permeability. The spectrally selective excitation pulse as a saturation pulse advantageously offers a possibility of improving the image quality by saturation when the suppression is applied.

In one conceivable embodiment of the method, the spectrally selective excitation pulse is configured to achieve different predetermined target magnetizations for nuclear spins with at least two predetermined different Larmor frequencies. By adjusting the amplitude for different frequency portions of the spectrally selective excitation pulse, in other words the spectral energy distribution, predetermined target magnetizations or flip angles for the nuclear spins may be set in a targeted fashion with different Larmor frequencies, e.g., with different first and second chemical bindings. One simple example is a saturation pulse, in which, as before, a saturation is set for a first binding type, while no change in the flip angle is produced for the other, second binding type. It would however also be conceivable, for instance, to change the flip angle of both binding types by different amounts simultaneously, in order thus advantageously to accelerate the method and/or reduce the SAR load.

In one possible embodiment of the method, in the act of determining a B0 field map, the B0 field map is determined as a function of B0 deviations induced by the patient. The B0 field map may be determined in advance by an MR measurement in the presence of the patient, for instance. It would also be conceivable, however, to model its effects on the homogenous B0 field in an automated calculation by the controller or to retrieve the same from a database on the basis of parameters of the patient such as, e.g., size, weight, and/or position. The thus determined B0 field map then enables, with the spectrally selective excitation pulse, the effects of these B0 variations caused by the patient to be compensated for and for instance the suppression of fat to be improved by the fat saturation in the image produced.

In one conceivable embodiment of the method, in a further act the controller determines a gradient pulse. This may depend on the sequence used and there in turn on the position of the volume elements to be acquired. The gradient pulse may be taken from a stored library of the controller, for instance, and adjusted by way of parameters. A calculation or an optimization method based on the fields to be achieved are also conceivable by the Biot-Savart law. It is also possible here to take into consideration dynamic effects such as eddy currents in the magnetic resonance tomography scanner. The result is a predetermined temporal course of the currents through the gradient coils.

In a further act, the specific gradient pulse is converted by way of the gradient controller into corresponding currents through the gradient coils and as a result produces the desired gradient fields.

The magnetic resonance tomography scanner and the method advantageously make it possible to take into consideration and compensate for the dynamic effects of the gradient pulses in the excitation pulses. In this way, the image quality may be improved, the outlay for the compensation or prevention of the eddy currents may be reduced or also the electromagnetic load (SAR) for the patient may be reduced or with the same load the image quality may be improved.

In one possible embodiment of the method, in one act, a physiological parameter of the patient is acquired by the controller. This may be weight, dimensions, position on the couch, or fat content, for instance. It is conceivable, for instance, for this physiological parameter to be carried out by operator input on an input device by entering the parameter or selection from predetermined templates. It is also possible, however, for a parameter to be determined automatically by sensors such as a camera or for weight or pressure or also by a rapid magnetic resonance measurement by the controller, for example.

In the act of determining the excitation pulse, this parameter is then taken into consideration by the controller. For instance, the field strength and the permeability, which vary as a result of the body weight and composition of the body, may be included in the Bloch equations. The result of the optimization method in this way then depends on the physiological parameter.

Magnetic resonance tomography scanners and the method are advantageously able to also optimize the image quality individually by taking into consideration properties of the patient.

In an embodiment, the excitation to be achieved is a spatial homogeneous fat saturation.

With the magnetic resonance imaging, the body fat is the most frequently disturbing substance because the body fat also has a high proton density and in terms of space may be packed tightly against other organs to be examined. On account of the somewhat different nuclear spins of the protons in the chemical bindings of the hydrocarbons, contrary to water, fat may be effectively suppressed by saturation pulses. On account of the minor frequency differences in the Larmor frequency, however, even minor magnetic field changes, such as are also caused dynamically by eddy currents, result in a faulty image quality. The magnetic resonance tomography scanner therefore uses the method to achieve an image improvement precisely with the fat saturation without complex hardware changes.

In one embodiment of the magnetic resonance tomography scanner, the transmitter of the magnetic resonance tomography scanner has a plurality of transmit channels. Outputs of the transmitter, at which an excitation pulse for feeding an antenna may be provided, are considered here to be transmit channels, wherein the signals of the transmit channels differ in amplitude, spectral power distribution, and/or phase. In the context of the disclosure, here an excitation pulse is also considered to be a vector which includes a number of excitation signals for individual transmit channels, which bring about the excitation of the nuclear spins to be achieved with a temporally coordinated transmission by way of the antenna in the examination volume. The antenna or transmit antenna may be an antenna array with a plurality of transmit elements, wherein the signal outputs have a signal connection in each case with at least one transmit element, in order to generate a magnetic alternating field. These may be individual or a number of elements of a birdcage antenna or a number of antenna coils of a local coil array, for instance.

In the act of emitting the excitation pulse, a predetermined spatial distribution of the excitation may thus be achieved as an additional degree of freedom by the interference of the signals of the plurality of transmit channels across a plurality of transmit elements of the antenna, which is set in the act of determining the excitation pulse by varying the phase and amplitude.

The homogeneity of the excitation may thus advantageously be improved with an even lower SAR load.

The disclosure also relates to a computer program product, which may be loaded directly into a processor of a programmable controller of the magnetic resonance tomography scanner, having program code in order to execute all the acts of a method when the program product is run on the controller.

The disclosure further relates to a computer-readable storage medium with electronically readable control information stored thereupon, which is configured such that it carries out the method when the storage medium is used in a controller of a magnetic resonance tomography scanner.

BRIEF DESCRIPTION OF THE DRAWINGS

The above-described characteristics, features, and advantages of this disclosure, as well as the manner in which these are realized, will become clearer and more readily understandable in connection with the following description of the exemplary embodiments, which are explained in more detail in conjunction with the drawings, in which:

FIG. 3 depicts a schematic flow chart of an example of a method.

DETAILED DESCRIPTION

Figure 1:
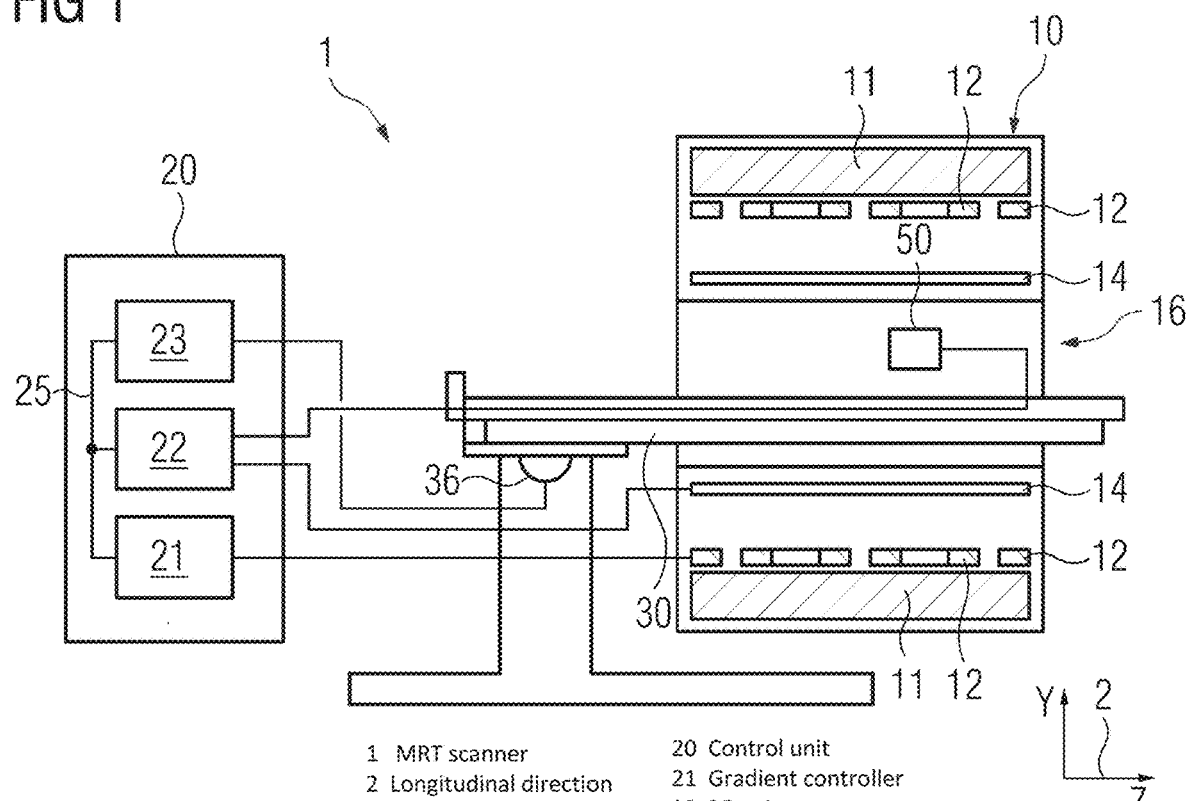
FIG. 1 depicts a schematic overview representation of an example of a magnetic resonance tomography scanner.

FIG. 1 depicts a schematic representation of an embodiment of a magnetic resonance tomography scanner 1 for realizing the method.

The magnet unit 10 has a field magnet 11, which produces a static magnetic field B0 for aligning nuclear spins of samples or of the patient in a recording area. The recording area is characterized by an homogenous static magnetic field B0, wherein the homogeneity relates, in particular, to the magnetic field strength or the sum. The recording area is almost spherical and arranged in a patient tunnel 16 which extends in a longitudinal direction 2 through the magnet unit 10. A patient couch 30 may be moved by the moving unit 36 in the patient tunnel 16. The field magnet 11 may be a superconducting magnet, which may provide magnetic fields having a magnetic flux density of up to 3T or even higher in the latest equipment. For lower field strengths, however, permanent magnets or electromagnets having resistive coils may also be used.

The magnet unit 10 further includes gradient coils 12 which are configured, for spatial differentiation of the acquired imaging regions in the examination volume, to overlay the magnetic field B0 with variable magnetic fields in three spatial directions. The gradient coils 12 may be coils made of normally conducting wires which may generate mutually orthogonal fields in the examination volume.

The magnet unit 10 also includes a body coil 14 which is configured to radiate a radio frequency signal supplied by way of a signal line into the examination volume and to receive resonance signals emitted by the patient 100 and to output the signals by way of a signal line.

A control unit 20 supplies the magnet unit 10 with the different signals for the gradient coils 12 and the body coil 14 and evaluates the received signals.

Accordingly, the control unit 20 has a gradient controller 21 which is configured to supply the gradient coils 12 via supply lines with variable currents which provide the desired gradient fields in the examination volume in a time-coordinated manner.

Furthermore, the control unit 20 has a radio frequency unit 22 with a transmitter 60, which is configured to generate a radio frequency pulse having a predetermined temporal sequence, amplitude, and spectral power distribution for exciting a magnetic resonance of the nuclear spins in the patient 100. Pulse powers in the kilowatt range may be achieved in this case. The excitation pulses may be radiated into the patient 100 by way of the body coil 14 or also by way of a local transmit antenna.

A controller 23 communicates with the gradient controller 21 and the radio frequency unit 22 via a signal bus 25.

Here, the gradient fields are temporally changing magnetic fields, which induce eddy currents through induction in electrically conducting elements of the construction and to a lesser degree also in the electrically conducting body, which in turn bring about opposite magnetic fields and thus locally attenuate the local static magnetic field. A magnetic field is considered here to be static if spectral portions with appreciable energy, in other words, e.g., basic signal and 2nd or 3rd harmonics, lie in a frequency range which is significantly lower than the Larmor frequency, e.g., by more than the factor 10, 100, or 1000 lower than the Larmor frequency. These eddy currents change the Larmor frequency of nuclear spins locally as a function of space and time. Excitation pulses for nuclear spins, which are transmitted at the same time or immediately after gradient pulses as part of an image acquisition sequence, change the achieved effect as a result, e.g., the flip angle and the desired excitation is not or not adequately achieved.

Aside from the construction of the magnetic resonance tomography scanner itself, other causes of a change in the static magnetic field lie above all in the patient 100. Due to the size and composition, this may change the magnetic field B0 as a result of the magnetic properties of the body tissue. Areas such as the shoulder and neck, in which different tissue types such as bones, muscles, tendons and fat are close to one another and influence the magnetic fields in particular through transitions between the tissues, are particularly critical here. In particular, these influences are changed again with each patient 100 and even with the same patient the ratios change with each image acquisition as a result of the position.

In accordance with the disclosure, it is therefore proposed to adjust the excitation pulse temporally and spatially to the magnetic field changes specified by the different causes, instead of minimizing the magnetic field changes with complicated structural measures.

Figure 2:
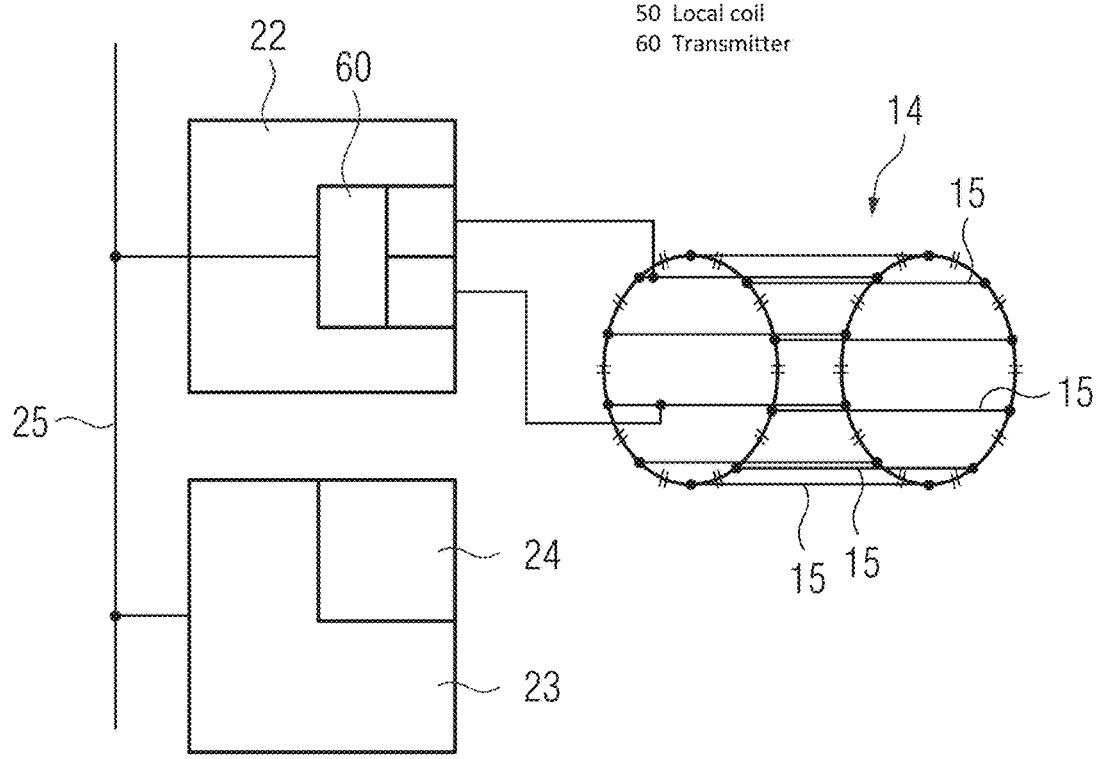
FIG. 2 depicts a schematic representation of a transmitter and an antenna of an embodiment of a magnetic resonance tomography scanner.

By way of example, FIG. 2 depicts schematically a transmitter 60 of a radio frequency unit 22 and as an antenna or transmit antenna a body coil 14 of a magnetic resonance tomography scanner 1, with which the corrected excitation pulse may be emitted in order to achieve the desired excitation. The transmitter is supplied here, by way of example, with data of the excitation pulse to be transmitted by the controller 23 by way of a signal bus 25 and the temporal coordination is controlled with the gradients or the sequence.

Here, the body coil 14 has a plurality of transmit elements 15, which are fed by a plurality of transmit channels. For the sake of clarity in FIG. 2, only two independent transmit channels are shown, which have a direct signal connection with two of the transmit elements. The further transmit elements are fed here by capacitive or inductive coupling. Different elliptical polarizations with corresponding spatial amplitude distribution may be produced with an activation of the transmit antenna of this type. With an increasing number of transmit elements 15 fed independently from different transmit channels, the number of degrees of freedom increases in order to adjust the spatial component of the field distribution more carefully.

Instead of the body coil 14, a local coil 50 with an array including antenna coils is also conceivable, for instance. Contrary to the body coil 14, here the active areas of the individual antenna coils are clearly less coupled or completely disjunct in the case of antenna coils which are distanced further from one another, so that the spatial distribution is provided above all by the position of the antenna coil and less by interference with the signals of the other antenna coils, which significantly simplifies the determination of the signals of the excitation pulse for the individual transmit channels.

According to the disclosure, it is also conceivable to use only one transmit channel and to optimize only the excitation pulse in terms of time according, e.g., to an eddy current which decays exponentially over time. The spatial component may be compensated here partially by a wider spectral distribution.

The magnetic resonance signals received by the local coil 50 as receive antenna are then prepared by a receiver of the radio frequency unit 22 and an image of the patient 100 is reconstructed therefrom by the controller 23 or a separate computer and is output on a monitor, for instance. It is also conceivable, however, for the antenna or transmit antenna to be used as the receive antenna.

FIG. 3 depicts a schematic representation of a schematic flow chart of an embodiment of the method.

In act S10, a static B0 field map of the MR scanner at least of the examination volume to be acquired is determined. The B0 field map may be stored in a storage unit 24 of the controller 23 for the magnetic resonance tomography scanner 1, for instance, and retrieved from there by the controller 23. Retrieval from an external storage unit or by way of a network is also conceivable, however.

The B0 field map may already be provided by simulation in the construction or by measurement with a field camera in the manufacturing process.

In addition or alternatively, the controller 23 may measure a B0 field map before measurement by a, e.g., rapid sequence, the field map determining the B0 changes brought about by the patient at least in the examination volume. It would also be possible to provide the B0 field map by simulation, possibly also with simplified assumptions, by the controller 23 itself.

In a further act S15, a B1 field map may be determined. As noted above, the B1 field map specifies variations in the amplitude of the radio frequency magnetic B1 alternating field, which is generated when an excitation pulse is transmitted by the transmitter by way of the antenna. This may also be caused, for instance, by the geometry of the antenna, or also by the interaction with the patient, e.g., a damping or absorption in the body. A B1 field map may be carried out, for instance, in advance or also with the patient by exciting and reading out a phantom, for instance by phase-sensitive mapping or by Bloch-Siegert shift.

In a further act S20, the controller 23 may additionally determine the gradient pulse, e.g., the temporal course of the current or currents through the gradient coils, in order to produce the magnetic field gradients required for image acquisition in the phase of the magnetic resonance sequence to be realized. This may take place, for instance, by the required data being retrieved from a table in the storage unit 24 of the controller 23 as a function of the sequence and the time instant in the sequence.

In a further act S30, the specific gradient pulse is converted by way of the gradient controller into corresponding currents through the gradient coils and as a result produces the desired gradient fields.

In a further act S40, the controller 23 determines the excitation to be achieved, e.g., the flip angle required, according to the sequence, for the nuclear spins to be excited. This may be different dependent on whether a saturation is to be achieved, for instance (flip angle approx. 90 degrees) or a spin echo (flip angle approx. 90 degrees or approx. 180 degrees). This may be carried out, for instance, by the required data being retrieved as a function of the sequence and the time instant in the sequence as in the case of the gradient pulse from a table in the storage unit 24 of the controller 23.

If the excitation of the controller to be achieved is known, according to the method this may determine an excitation pulse in a subsequent act S50, which generates the excitation of the nuclear spins to be achieved in the patient when emitted by the transmitter by way of the transmit antenna.

One possibility would be the execution of an optimization method, for instance. The static basic value for the magnetic field B0 may be taken from the B0 field map for each location in the examination volume.

In one embodiment of the method, magnetic field interferences caused by the patient may also be taken into consideration, if, in one act, information relating to the patient is acquired by sensors, a camera or also by a magnetic resonance measurement. The patient may dampen alternating fields by absorption, for instance, eddy currents may be induced in the conducting tissue and organ limits may bring about permeability fluctuations.

The gradient field for each location in the examination volume may be determined with its temporal curve by the Biot-Savart law from the known gradient pulse and the geometry of the gradient coils. With the knowledge of the structural details, in particular the arrangement of metal surfaces, eddy currents produced thereby may also be simulated from the gradient fields and thus also determine a dynamic portion of the magnetic field B0 for each location.

With a known excitation pulse and known transmit antenna geometry the local field strength of the magnetic alternating field B1 may likewise be determined by the Maxwell equations.

On the basis of an excitation pulse assumed to be a start value, the achieved flip angle may be calculated by Bloch equations and the static and dynamic B0 field for each location of the examination volume. Depending on the embodiment of the method, static deviations as a result of the patient and/or dynamic effects as a result of eddy currents are taken into consideration here. The deviation from the excitation to be achieved is then reduced in an iterative optimization method (e.g., LSR), until it lies below a predetermined limit value.

When dynamic effects are taken into consideration, the optimization for various time instants relative to the course of the gradient pulse may be repeated, in order also to take into consideration exponentially decaying eddy currents.

In this way, a respectively temporary excitation pulse with amplitude, phase and spectral distribution is determined for the transmit channel/channels by way of different time instants. A temporally changing excitation pulse with the components for the individual transmit channels may be determined herefrom by interpolation.

In act S60, the excitation pulse and the gradient pulse is finally output in the temporal relation predetermined by the sequence and assumed in the optimization.

Magnetic resonance signals from the body are then recorded by a receiver of the radio frequency unit 22 by way of the local coil 50 and prepared for an image reconstruction by the controller 23 or a dedicated image reconstruction unit.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

Although the disclosure has been illustrated and described in greater detail with the exemplary embodiments, the disclosure is not restricted by the examples disclosed and other variations may be derived therefrom by the person skilled in the art without departing from the protective scope of the disclosure.

The invention claimed is:

1. A method for operating a magnetic resonance tomography scanner, the method comprising:
   generating, by a field magnet of the magnetic resonance tomography scanner, a B0 field;
   providing, by a controller of the magnetic resonance tomography scanner, a B0 field map;
   generating, by gradient coils of the magnetic resonance tomography scanner, magnetic gradient fields;
   generating, by a transmitter and an antenna of the magnetic resonance tomography scanner, a magnetic alternating field B1 for exciting nuclear spins in a patient;
   receiving, a receive antenna and a receiver of the magnetic resonance tomography scanner, a magnetic resonance signal from the patient;
   determining, by the controller, an excitation of the nuclear spins to be achieved for an image acquisition sequence;
   determining, by the controller, a spectrally selective excitation pulse for transmission by the transmitter via the antenna as a function of the B0 field map, wherein the spectrally selective excitation pulse generates the excitation of the nuclear spins in the patient and achieves predetermined different target magnetizations for the nuclear spins with at least two different Larmor frequencies;
   outputting, by the controller, a gradient pulse by way of the gradient coils; and
   outputting, by the controller, the spectrally selective excitation pulse by way of the antenna.

2. The method of claim 1, further comprising:
determining a B1 field map,
wherein the determining of the spectrally selective excitation pulse is further determined as a function of the B1 field map.

3. The method of claim 2, further comprising:
acquiring a physiological parameter of the patient,
wherein the spectrally selective excitation pulse is further determined as a function of the physiological parameter of the patient.

4. The method of claim 2, wherein the spectrally selective excitation pulse is further configured to achieve a saturation of the nuclear spins as excitation to be achieved.

5. The method of claim 1, wherein the spectrally selective excitation pulse is further configured to achieve a saturation of the nuclear spins as excitation to be achieved.

6. The method of claim 1, wherein the B0 field map is determined as a function of B0 deviations induced by the patient.

7. The method of claim 6, further comprising:
determining the gradient pulse,
wherein the B0 field map is determined as a function of dynamic effects of the B0 deviations caused by the magnetic gradient fields at a point in time of the spectrally selective excitation pulse, and
wherein the spectrally selective excitation pulse is output during the output of the gradient pulse by way of the gradient coils.

8. The method of claim 1, further comprising:
determining the gradient pulse,
wherein the B0 field map is determined as a function of dynamic effects of B0 deviations caused by the magnetic gradient fields at a point in time of the spectrally selective excitation pulse, and
wherein the spectrally selective excitation pulse is output during the output of the gradient pulse by way of the gradient coils.

9. The method of claim 1, further comprising:
acquiring a physiological parameter of the patient,
wherein the spectrally selective excitation pulse is determined as a function of the physiological parameter of the patient.

10. The method of claim 1, wherein the transmitter of the magnetic resonance tomography scanner comprises a plurality of transmit channels in signal connection with a plurality of transmit elements of the antenna, and
wherein the spectrally selective excitation pulse has a plurality of components for the plurality of transmit channels.

11. A magnetic resonance tomography scanner comprising:
a controller;
a field magnet for generating a static homogenous magnetic field B0;
gradient coils for generating magnetic gradient fields;
a transmitter and an antenna for generating a magnetic alternating field B1 for exciting nuclear spins in a patient; and
a receive antenna and a receiver for receiving a magnetic resonance signal from the patient,
wherein the controller is configured to:
provide a static B0 field map;
provide a gradient pulse for an image acquisition sequence;
determine an excitation of the nuclear spins to be achieved for the image acquisition sequence;
determine an excitation pulse for transmission through the transmitter by way of the antenna as a function of the B0 field map, wherein the excitation pulse is configured to generate the excitation of the nuclear spins to be achieved in the patient and achieve predetermined different target magnetizations for nuclear spins with at least two different Larmor frequencies;
output the gradient pulse by way of the gradient coils; and
output the excitation pulse by way of the antenna.

12. The magnetic resonance tomography scanner of claim 11, wherein the transmitter comprises a plurality of transmit channels in signal connection with a plurality of transmit elements of the antenna, and
wherein the excitation pulse has a plurality of components for the plurality of transmit channels.

13. The magnetic resonance tomography scanner of claim 11, wherein the controller is further configured to determine a B1 field map, and
wherein the determination of the excitation pulse is further determined as a function of the B1 field map.

14. The magnetic resonance tomography scanner of claim 13, wherein the controller is further configured to acquire a physiological parameter of the patient, and
wherein the excitation pulse is further determined as a function of the physiological parameter of the patient.

15. The magnetic resonance tomography scanner of claim 13, wherein the excitation pulse is further configured to achieve a saturation of the nuclear spins as excitation to be achieved.

16. The magnetic resonance tomography scanner of claim 11, wherein the excitation pulse is further configured to achieve a saturation of the nuclear spins as excitation to be achieved.

17. The magnetic resonance tomography scanner of claim 11, wherein the B0 field map is determined as a function of B0 deviations induced by the patient.

18. The magnetic resonance tomography scanner of claim 17, wherein the controller is further configured to determine the gradient pulse,
wherein the B0 field map is determined as a function of dynamic effects of the B0 deviations caused by the magnetic gradient fields at a point in time of the excitation pulse, and
wherein the excitation pulse is output during the output of the gradient pulse by way of the gradient coils.

19. The magnetic resonance tomography scanner of claim 11, wherein the controller is further configured to determine the gradient pulse,
wherein the B0 field map is determined as a function of dynamic effects of B0 deviations caused by the magnetic gradient fields at a point in time of the excitation pulse, and
wherein the excitation pulse is output during the output of the gradient pulse by way of the gradient coils.

20. The magnetic resonance tomography scanner of claim 11, wherein the controller is further configured to acquire a physiological parameter of the patient, and
wherein the excitation pulse is determined as a function of the physiological parameter of the patient.

* * * * *